US006935638B2

(12) United States Patent
Ivanov et al.

(10) Patent No.: US 6,935,638 B2
(45) Date of Patent: Aug. 30, 2005

(54) UNIVERSAL SUBSTRATE HOLDER FOR TREATING OBJECTS IN FLUIDS

(75) Inventors: Igor C. Ivanov, Dublin, CA (US); Jonathan Weiguo Zhang, San Jose, CA (US)

(73) Assignee: Blue29, LLC, Sunnyvale, CA (US)

( * ) Notice: Subject to any disclaimer, the term of this patent is extended or adjusted under 35 U.S.C. 154(b) by 61 days.

(21) Appl. No.: 10/369,878

(22) Filed: Feb. 21, 2003

(65) Prior Publication Data

US 2004/0164504 A1 Aug. 26, 2004

(51) Int. Cl.$^7$ ............................................. B23B 31/103
(52) U.S. Cl. ........................ 279/106; 118/416; 118/500; 118/503; 279/129
(58) Field of Search ............................ 118/52, 320, 321, 118/500, 503, 730, 416; 279/35, 106, 129, 131, 141; 451/379, 385, 398

(56) References Cited

U.S. PATENT DOCUMENTS

| | | | |
|---|---|---|---|
| 4,747,608 A | | 5/1988 | Sato et al. |
| 5,421,056 A | * | 6/1995 | Tateyama et al. .............. 15/302 |
| 5,443,648 A | * | 8/1995 | Ohkase ........................ 118/724 |
| 5,462,603 A | * | 10/1995 | Murakami ................... 118/719 |
| 5,500,315 A | | 3/1996 | Calvert et al. |
| 5,656,082 A | * | 8/1997 | Takatsuki et al. ............. 118/52 |
| 5,830,805 A | | 11/1998 | Shacham-Diamand et al. |
| 5,989,342 A | * | 11/1999 | Ikeda et al. .................... 118/52 |
| 6,159,541 A | * | 12/2000 | Sakai et al. .................. 427/240 |
| 6,171,402 B1 | * | 1/2001 | Strodtbeck et al. .......... 118/712 |
| 6,267,853 B1 | | 7/2001 | Dordi et al. |
| 6,672,318 B1 | * | 1/2004 | Tsuchiya et al. ............. 134/147 |
| 6,689,221 B2 | * | 2/2004 | Ryding et al. ............... 118/730 |
| 6,761,362 B2 | * | 7/2004 | Noguchi ...................... 279/106 |
| 2002/0153676 A1 | | 10/2002 | Noguchi ...................... 279/106 |
| 2004/0013797 A1 | * | 1/2004 | Thompson et al. .......... 427/240 |
| 2004/0250755 A1 | * | 12/2004 | Ivanov et al. .................. 118/50 |

FOREIGN PATENT DOCUMENTS

WO          WO 02/06067          5/2002

OTHER PUBLICATIONS

International Search Report, PCT/US04/05214, mailed Jan. 11, 2005.

* cited by examiner

Primary Examiner—Willmon Fridie, Jr.
Assistant Examiner—Michael W. Talbot
(74) Attorney, Agent, or Firm—Mollie E. Lettang; Daffer McDaniel, LLP

(57) ABSTRACT

A universal substrate holder of the invention for treating wafer substrates in liquids is provided with a shaft and a rod slidingly inserted into the central opening of the shaft. The end of the shaft that protrudes into the bowl supports a base platform for the substrate, while the end of the rod that protrudes into the bowl has radial arms that rigidly support an annular plate with pins that can pass through the opening of the base platform so that they can support the substrate above the surface of the platform. The annular plate supports clamping jaws made in the form of two-arm levers with shorter arms and longer arms. The longer arms are heavier and therefore in the stationary state of the holder keep the jaws turned into an open position. When the shaft begins to rotate, the jaws are turned under the effect of centrifugal forces into positions of clamping the substrate with the shorter arms. When the rod is pulled down, the ends of the longer arms come into contact with the base platform and are turned into the clamping position. The substrate holder of the invention allows clamping and releasing of the substrate in positions of the substrate above the platform and in a position of the substrate on the base substrate, when the backside of the substrate is inaccessible to the process liquid.

20 Claims, 7 Drawing Sheets

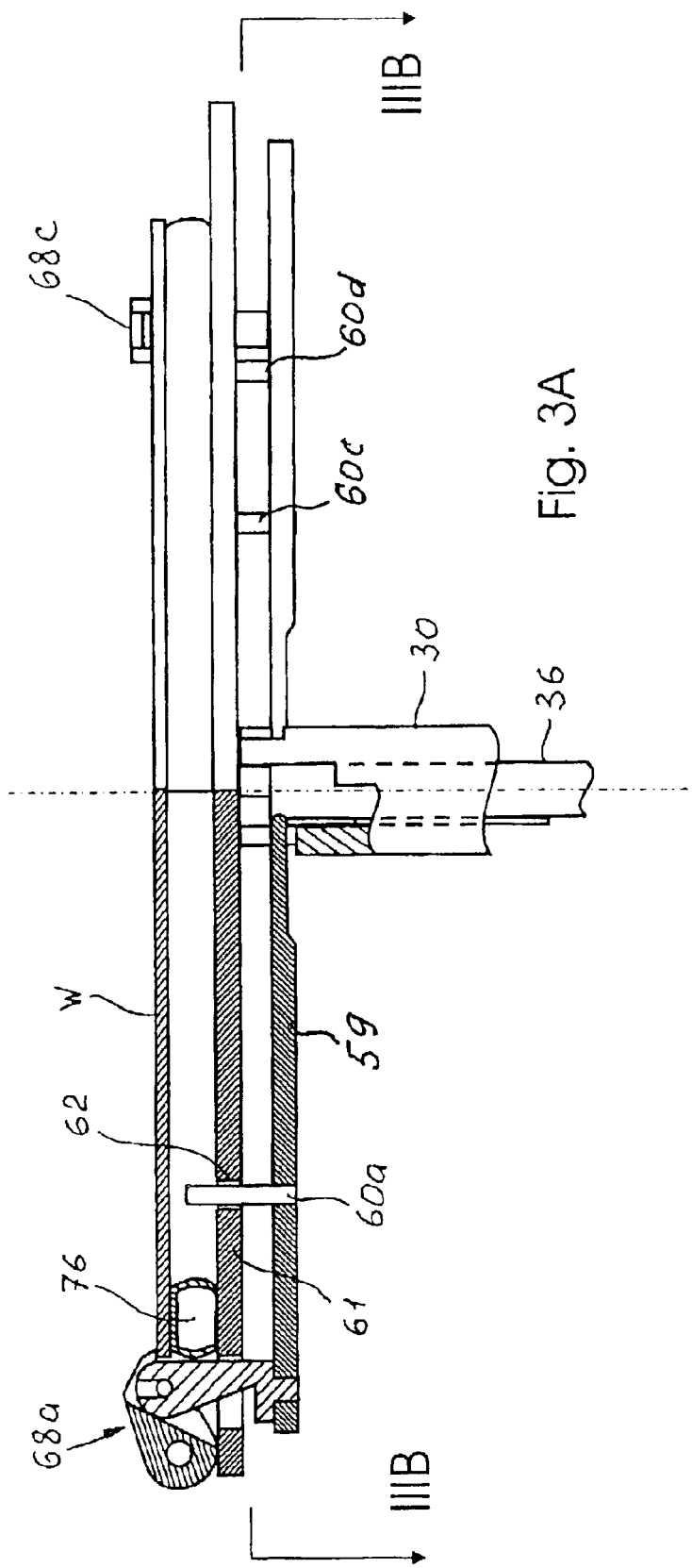

UNIVERSAL SUBSTRATE HOLDER FOR TREATING OBJECTS IN FLUIDS

FIELD OF THE INVENTION

The present invention relates to semiconductor production equipment, in particular, to a universal substrate holder or chuck for holding semiconductor substrates during treatment in fluids, e.g., to a wafer substrate chuck used in an apparatus for electroless deposition of materials on semiconductor substrates.

BACKGROUND OF THE INVENTION

Manufacturing of semiconductor devices, in particular integrated circuits having multiple-layered structures with various metal and non-metal layers laminated on a semiconductor substrate, typically involves applications, of several metal layers onto a substrate or onto other previously deposited layers. These layers may have a complicated planer topology since these layers may constitute thousands of individual devices, which in combination form an integrated circuit or so-called "chip". Modern chips may have metal or dielectric layers with thicknesses from tens of Angstroms to fractions of a micron.

It is understood that thin metallic filing used in integrated circuits of semiconductor devices function as conductors of electric current. Furthermore, it is known that densities of signal currents in metallic interconnections used in integrated circuits may reach extremely high values that generate such phenomena as electromigration associated with spatial transfer of mass of conductor films. Therefore the characteristics and properties of the deposited metal films (uniformity of film thickness, low electrical resistivity, etc.) determine performance characteristics and quality of the integrated circuit and of the semiconductor device as a whole.

In view of the above, thin metal films used in integrated circuits should satisfy very strict technical requirements relating to metal deposition processes, as well as to repeatability and controllability of the aforementioned processes.

A wide range of metals is utilized in tho microelectronic manufacturing industry for the formation of integrated circuits. These metals include, for example, nickel, tungsten, platinum, copper, cobalt, as well as alloys of electrically conductive compounds such as silicides, solders, etc. It is also known that coating films are applied onto substrates with the use of a variety of technological processes such chemical vapor deposition (CVD), physical vapor deposition (PVD), electroplating, and electroless plating. Of these techniques, electroplating and electroless plating or deposition tend to be the most economical and most promising for improvement in characteristics of the deposited films. Therefore, electroplating and electroless plating techniques successfully replace other technologies.

Electroplating and electroless plating can be used for the deposition of continuous metal layers as well as patterned metal layers. One of the process sequences used by the microelectronic manufacturing industry to deposit metals onto semiconductor wafers is known to as "damascene" processing. In such processing, holes, commonly called "vias", trenches and/or other recesses are formed on a workpiece and filled with a metal, such as copper. In the damascene process, the wafer, with vias and trenches etched in the dielectric material, is first provided with a metallic seed layer, which is used to conduct electrical current during a subsequent metal electroplating step. If a metal such as copper is used, the seed layer is disposed over a barrier layer material, such as Ti, TiN, etc. The seed layer is a very thin layer of metal, which can be applied using one or more processes. For example, the seed layer of metal can be laid down using physical vapor deposition or chemical vapor deposition processes to produce a layer with the thickness on the order of 1,000 Angstroms. The seed layer can advantageously be formed of copper, gold, nickel, palladium, or other metals. The seed layer is formed over a surface, which may contain vias, trenches, or other recessed device features.

A metal layer is then electroplated onto the seed layer in the form of a continuous layer. The continuous layer is plated to form an overlying layer, with the goal of providing a metal layer that fills the trenches and vias and extends a certain amount above these features. Such a continuous layer will typically have a thickness on the order of 5,000 to 15,000 Angstroms (0.5–1.5 microns).

After the continuous layer has been electroplated onto the semiconductor wafer, excess metal material present outside of the vias, trenches, or other recesses is removed. The metal is removed to provide a resulting pattern of metal layer in the semiconductor integrated circuit being formed. The excess plated material can be removed, for example, using chemical mechanical planarization. Chemical mechanical planarization is a processing step, which uses the combined action of chemical removal agents, or a chemical removal agents with an abrasive, which grinds and polishes the exposed metal surface to remove undesired parts of the metal layer applied in the electroplating step.

One drawback associated with copper deposition by electroplating is the fact that for very small features on microelectronic workpieces (sub 0.1 micron features), copper deposition by electroplating can lack conformity with the side walls of high aspect ratio vias and trenches, and can produce voids in the formed interconnects and plugs (vias). This is often due to the non-conformity of the copper seed layer deposited by PVD or CVD. As a result, the seed layer may not be thick enough to carry the current to the bottom of high aspect ratio features.

An alternate process for depositing copper onto a microelectronic workpiece is known as "electroless" plating which is the deposition of metals on a catalytic surface from a solution without an external source of current. For example, this process can be used as a preliminary step in preparing plastic articles for conventional electroplating. After cleaning and etching, the plastic surface is immersed in solutions that react to precipitate a catalytic metal in situ, palladium, for example. First the plastic is placed in an acidic stannous chloride solution, then into a solution of palladium chloride; palladium is reduced to its catalytic metallic state by the tin. Another way of producing a catalytic surface is to immerse the plastic article in a colloidal solution of palladium followed by immersion in an accelerator solution. The plastic article thus treated can now be plated with nickel or copper by the electroless method, which forms a conductive surface, which then can be plated with other metals by a conventional electroplating method.

As compared to electroplating, the electroless plating or deposition is a selective process, which can be realized with very thin seeds or without the use of seeds at all. Since electroless process is not associated with the use of an external electric current source, the electroless deposition results in more uniform coatings in view of the absence of discrete contacts. Electroless deposition can be realized with the use of simple and inexpensive equipment and with a high aspect ratio gap fill.

Given below are examples of existing methods and apparatuses for electroless deposition, specifically for use in the manufacture of semiconductor devices.

U.S. Pat. No. 5,500,315 issued in 1996 to J. Calvert, et al. discloses an electroless metal plating-catalyst system that overcomes many of the limitations of prior systems. In one aspect of the invention, the process comprises the steps of: providing a substrate with one or more chemical groups capable of ligating to an electroless deposition catalyst, at least a portion of the chemical groups being chemically bonded to the substrate; contacting the substrate with the electroless metal plating catalyst; and contacting the substrate with an electroless metal plating solution to form a metal deposit on the substrate. The chemical groups can be, for example, covalently bonded to the substrate. In another preferred aspect, the invention provides a process for selective electroless metallization, comprising steps of selectively modifying the reactivity of a substrate to an electroless metallization catalyst; contacting the substrate with the electroless metallization catalyst; and contacting the substrate with an electroless metallization solution to form a selective electroless deposit on the substrate. The substrate reactivity can be modified by selective treatment of catalyst ligating groups or precursors thereof on the substrate, for example by isomerization, photocleavage or other transformation of the ligating or precursor groups. Such-direct modification enables selective plating in a much more direct and convenient manner than prior selective plating techniques. Specifically, the aforementioned patent provides selective electroless deposition without the use of a photoresist or an adsorption type tin-containing plating catalyst.

U.S. Pat. No. 5,830,805 issued in 1998 to Y. Shacham-Diamand, et al. This patent discloses an electroless deposition apparatus and method of performing electroless deposition for processing a semiconductor wafer that use a closed processing chamber to subject the wafer to more than one processing fluid while retaining the wafer within the chamber. The invention is useful for manufacturing processes that include depositing, etching, cleaning, rinsing, and/or drying. The processing chamber used in the preferred embodiment of the apparatus of the above patent is an enclosed container capable of holding one or more semiconductor wafers. A distribution system introduces a first fluid into the chamber for processing the wafer and then removes the first fluid from the chamber after processing the wafer. The distribution system then introduces the next fluid into the chamber for processing the wafer and then removes the next fluid from the chamber after processing the wafer. This procedure continues until the manufacturing process finishes. The fluids used in the present invention depends on the process performed and may include fluids such as DI water, $N_2$ for flushing, and electrolytic solutions comprising reducing agents, complexing agents, or pH adjusters.

The fluid enters the sealed processing chamber through an inlet, and exits the chamber through an outlet. As the fluid enters the processing chamber, the fluid is dispersed across the wafer in a uniform flow. A recirculation system moves the fluid through the processing chamber using a temperature control system, chemical concentration monitoring system, pump system, and a filtration system before re-circulating the fluid back through the processing chamber.

An essential part of any apparatus for treating wafer substrates in fluids, in particular of an apparatus for electroless deposition of a thin film onto a wafer substrate, is a wafer substrate holder or chuck which is used for holding the substrate during treatment at various stages of the process, such as coating, deposition, cleaning, rinsing, drying, etc.

One such substrate holder is described in U.S. Pat. No. 6,267,853 issued in 2001 to Y. Dordi, et al. This substrate holder has a pedestal that supports the substrate on the pedestal upper surface during processing. The pedestal actuator rotates the pedestal to spin the substrate and raises and lowers the pedestal relative to nozzles that supply the processing solutions. The substrate may be held in place on the pedestal by a plurality of clamps installed on the ends of radial arms attached to the upper end of the rotating pedestal. The clamps pivot with centrifugal force and engage the substrate preferably in the edge exclusion zone of the substrate. The entire substrate holder is located inside a bowl which can be filled with the process solution. For loading a substrate, the pedestal with the clamps is raised to a loading position with the clamps being open. After the substrate has been loaded, the pedestal is moved down to immerse the substrate into the solution. On its way down to the bowl, the clamps are released from the engagement with the clamp-opening ring and clamp the edges of the substrate. During its vertical movement from the pedestal actuator, the substrate can be stopped in an intermediate position approximately in the middle of the bowl height and so that the substrate is position between the upper and lower nozzles. As a result, the processing liquid can supplied to the upper and to the lower surface of the substrate simultaneously or selectively.

A main disadvantage of the substrate holder of U.S. Pat. No. 6,267,853 is that the backside surface always remains exposed to the action of the solution. In other words, the aforementioned device does not allow processing of one side of the substrate, while the other side is sealed against the process solution.

A substrate holder similar to the one described above is disclosed in International Patent Publication WO 02/063067 filed by Hiroshi Sato in 2002. The holder is provided with a platform which has on its periphery clamping jaws activated under the effect of centrifugal forces. The clamps are installed on vertical posts that provide a space between the platform and the bottom of the substrate for accommodating lower nozzles aimed at the backside periphery portion of the substrate. A group of other nozzles is arranged above the substrate. This holder is intended for holding the substrate during processing the substrate simultaneously from both sides. The main object of the aforementioned invention is to provide uniformity of treatment and to supply the processing solution to the edges and to the central parts of the substrate.

U.S. Pat. No. 4,747,608, issued in 1988 to Mitsuya Sato at al. describes a wafer chuck with radial clamps located under the edges of a substrate and which are moveable vertically and radially for clamping the edges of the substrate. For this purpose the clamps are provided with stopper projections that engage the substrate edge during a combined vertical and radial movement achieved due to the use of a complicated kinematic system. The chuck of this type is inapplicable for processing a substrate in liquids, especially for rotation with high speeds.

Thus it can be concluded that none of the aforementioned known substrate holders possesses universality and is capable of selectively providing treatment of substrates from both sides or only from the face side, while protecting the backside of the substrate from the effect of the process solution. Furthermore, some of the known holders have a complicated construction, and none of them utilize one and the same element for two functions, such as supporting the substrate and controlling operation of substrate clamping elements.

SUMMARY OF THE INVENTION

It is an object of the invention to provide a substrate holder for treatment of substrates in liquids, which possesses universality and is capable of selectively providing treatment of substrates from both sides or only from the face side, while protecting the backside of the substrate from the effect of the process solution. It is another object to provide a substrate holder of the aforementioned type, which is simple in construction and utilizes one and the same element for two functions, such as supporting the substrate and controlling operation of substrate clamping elements.

A universal substrate holder of the invention for treating wafer substrates in liquids, e.g., for use in, electroless deposition apparatuses, has a housing with a bowl which is sealed from the housing and can be filled with a deposition solution, rinsing solution, cleaning solution, or the like. The holder is provided with a shaft, one end of which protrudes into the bowl and the opposite end is connected to a rotary drive. A rod is slidingly inserted into the central opening of the shaft so that it can slide inside but cannot rotate relative to the shaft. The end of the shaft that protrudes into the bowl supports a base platform for the substrate, while the end of the rod that protrudes into the bowl has radial arms rigidly connected to an annular plate with pins that pass through the opening of the base platform so that they can support the substrate above the surface of the platform. In positions beyond the substrate periphery, supports clamping jaws are arranged, in the form of two-arm levers with a shorter and a longer arm. The longer arm is heavier and therefore in the stationary state of the holder keeps the jaw turned into an open position. When the shaft begins to rotate, the heavier arms of the jaws are turned under the effect of centrifugal forces into positions of clamping the substrate edge with the shorter arms. Furthermore, when the rod is pulled down, the ends of the longer arms come into contact with the base platform end are turned into the clamping position, even though the shaft is in a stationary state. The substrate holder of the invention possesses universality as it allows clamping and releasing of the substrate in the position of the substrate above the platform for treating the substrate from both sides or for drying and in the position of the substrate on the base platform, when the backside of the substrate is inaccessible to the process liquid.

BRIEF DESCRIPTION OF THE DRAWINGS

FIG. 3A is a vertical sectional view of the substrate holder along line IIIA—IIIA of FIG. 1.

DESCRIPTION OF THE INVENTION

Figure 1:
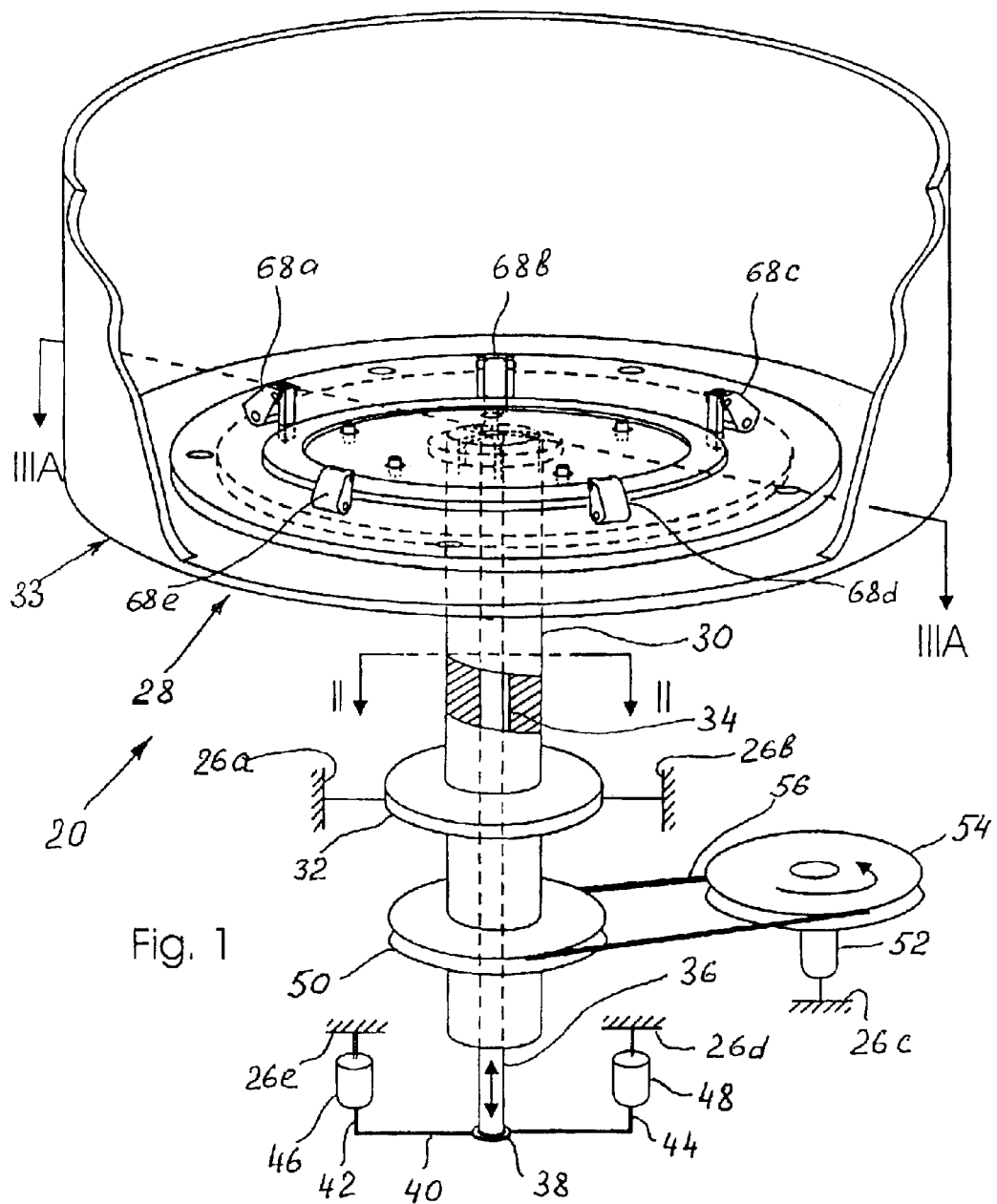
FIG. 1 is general three-dimensional view on the part of an electroless deposition apparatus that incorporates the substrate holder of the invention.

A general three-dimensional view of the part of an electroless deposition apparatus that incorporates the substrate holder of the invention is shown in FIG. 1. The apparatus, which in general is designated by reference numeral 20 is shown without a housing and with a part of a bowl removed for exposing inner parts of the substrate holder. It is also understood that reference to the electroless deposition apparatus is given only as an example and that any other apparatus or machine for treating flat objects in a fluid may incorporate the holder of the invention.

The apparatus 20 has a housing, which in the embodiment of FIG. 1 is shown conventionally by lines with hatchings 26a, 26b, 26c, 26d, and 26e. It is assumed that the housing supports a bowl 28 with an open top side.

Figure 2:
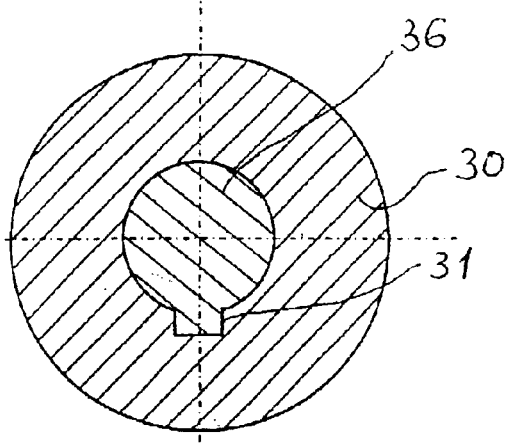
FIG. 2 is a sectional view of the shaft along line II—II of FIG. 1.

The parts and elements described below constitute a substrate holder, which as a whole is designated by reference numeral 33. More specifically, the substrate holder 33 has a vertical shaft 30, which is rotatingly supported in the housing part 26a, 26b by bearings 32. The shaft 30 has a central opening 34, into which a rod 36 is inserted with a sliding fit. The rod 36 can slide inside the opening 34 of the shaft 30 on a spline 31 shown in FIG. 2, which is a cross section of the shaft 30 along the line II—II, but cannot rotation with respect to the shaft 30.

The lower end of the rod 36 is supported by a thrust bearing 38 (FIG. 1) installed on a cross beam 40. The ends of the cross beam 40 are rigidly connected to piston rods 42 and 44 of two synchronously operating pneumatic or hydraulic cylinder 46 and 48, respectively, which are rigidly fixed in the housing parts 26e and 26d. Thus, extension and withdrawal of the piston rods 42 and 44 from and into the respective cylinders cause vertical downward and upward movements of the rod 36 inside the shaft 30.

The lower end of the shaft 30 rigidly supports a driven pulley 50, which is driven into rotation from a motor 52 through a driving pulley 54 on the shaft of the motor 52 and a driving belt 56. It is understood that due to the provision of the spline 31 (FIG. 2), the rod will rotate together with the shaft 30, irrespective of the vertical movements inside the shaft. The upper end of the shaft 30 passes upward through the housing into the bowl 28 via a seal ring (not shown).

Figure 3B:
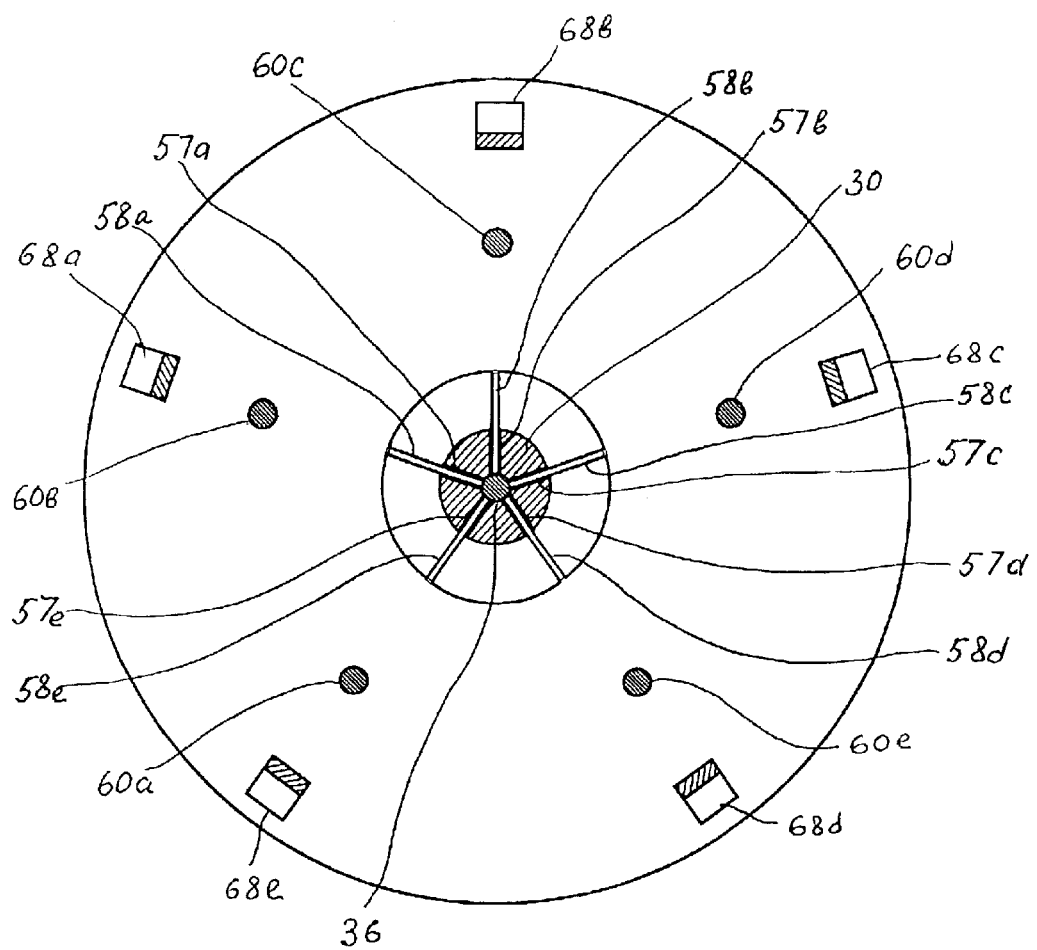
FIG. 3B is a transverse sectional view of the substrate holder of FIG. 3A along the line IIB—IIB of FIG. 3A.

FIG. 3A is a vertical sectional view of the substrate holder along line IIA—IIA of FIG. 1, FIG. 3B is a transverse sectional view of the substrate holder of FIG. 3A along the line IIB—IIB of FIG. 3A. As can be better seen in FIG. 3B, the upper end face of the shaft 30 has several radial slots, five in the illustrated embodiment. In FIG. 3B these slots are designated by reference numerals 57a, 57b, 57c, 57d, and 57e. The slots 57a, 57b, 57c, 57d, and 57e accommodate radial arms 58a, 58b, 58c, 58d, and 58e. These arms are rigidly connected to the upper end of the rod 36 and have a sliding fit in the aforementioned slots 57a, 57b, 57c, 57d, and 57e. The radial arms support an annular plate 59 (FIGS. 3A and 3B), which is rigidly connected. e.g., welded, to the lower sides of the aforementioned radial arms. The annular plate 59 carries vertical pins 60a, 60b, 60c, 60d, and 60e (FIGS. 3A and 3B), which are rigidly attached to this plate. On the other hand, the upper end face of the shaft 30 rigidly supports a base platform 61 (see FIG. 3A) with a plurality of openings, the number of which corresponds to the number of the pins 60a, 60b, 60c, 60d, and 60e (only one such opening, i.e., an opening 62, is shown in FIG. 3A). The pins 60a, 60b, 60c, 60d, and 60e pass with a sliding fit through the respective openings in the base platform 61.

The annular plate 59 also supports clamping or restricting jaws 68a, 68b, 68c, 68d, and 68e. The arrangement of one of the clamping jaws, e.g., of the clamping jaw 68a with respect to the base platform 61 and a wafer substrate W is shown in more detail in FIG. 4, which is a fragment of FIG. 3 shown on a larger scale. It is understood that other clamping jaws are identical to the clamping jaw 68a and therefore the description of the clamping jaw 68a is equally applicable to the remaining clamping jaws as well. It can be seen from FIG. 4, that the clamping jaw 68a has a projection 69, which is rigidly attached to the annular plate 59, e.g., via a pressure fit, and sealingly passes through the respective opening 71 in the base platform 61. The clamping jaws are located outside of and close to the peripheral edge of the wafer substrate W. The clamping jaw 68a (as well as all other identical clamping jaws) comprises a two-arm lever pivoted on a pivot 70a and has a shorter arm 68a1, which is lighter in weight, and a longer arm 68a2, which is heavier in weight. Since the longer arm 68a2 is heavier, in a static state shown in FIG. 4 the clamping jaw 68a is tilted to a position shown in FIG. 4 with its shorter arm 68a1 raised upward.

Figure 4:
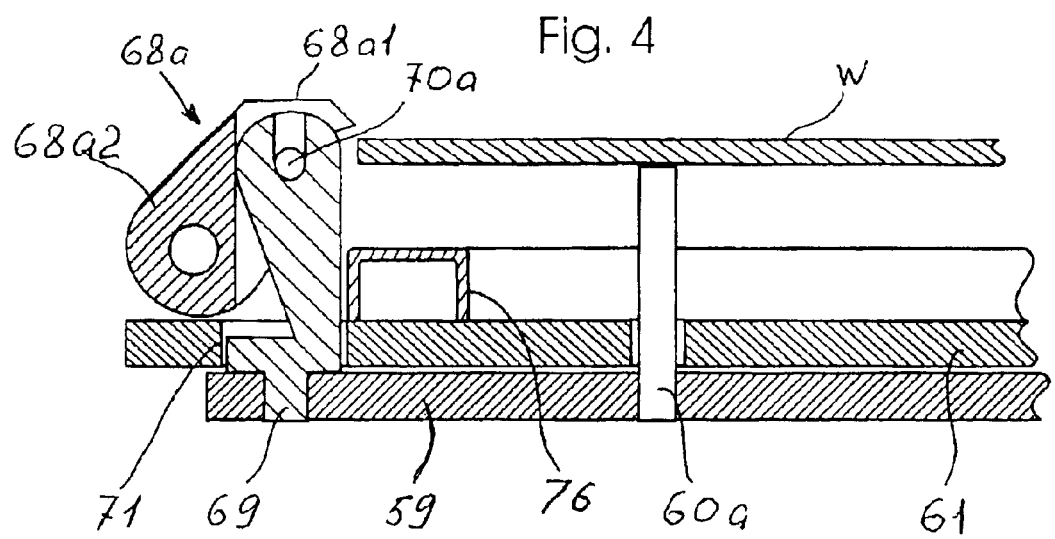
FIG. 4 is a fragment of FIG. 3A that illustrates in more detail the arrangement of one of the clamping jaws with respect to the supporting annular plate and the base platform.

In FIG. 4 the pin 60a is shown in the uppermost position which assumes after the rod 36 has been shifted to the end of its upward stroke inside the shaft 30 under the control of cylinders 46 and 48 (FIG. 1). Reference numeral 76 in FIG. 4 designates an annular seal, which is placed onto the upper surface of the base platform 61 under the edge of the wafer substrate W for sealing the backside of the wafer substrate from the process solution during treatment of the face side of the wafer substrate W, when the wafer substrate rests onto the base platform 61, as will be described later.

Figure 5:
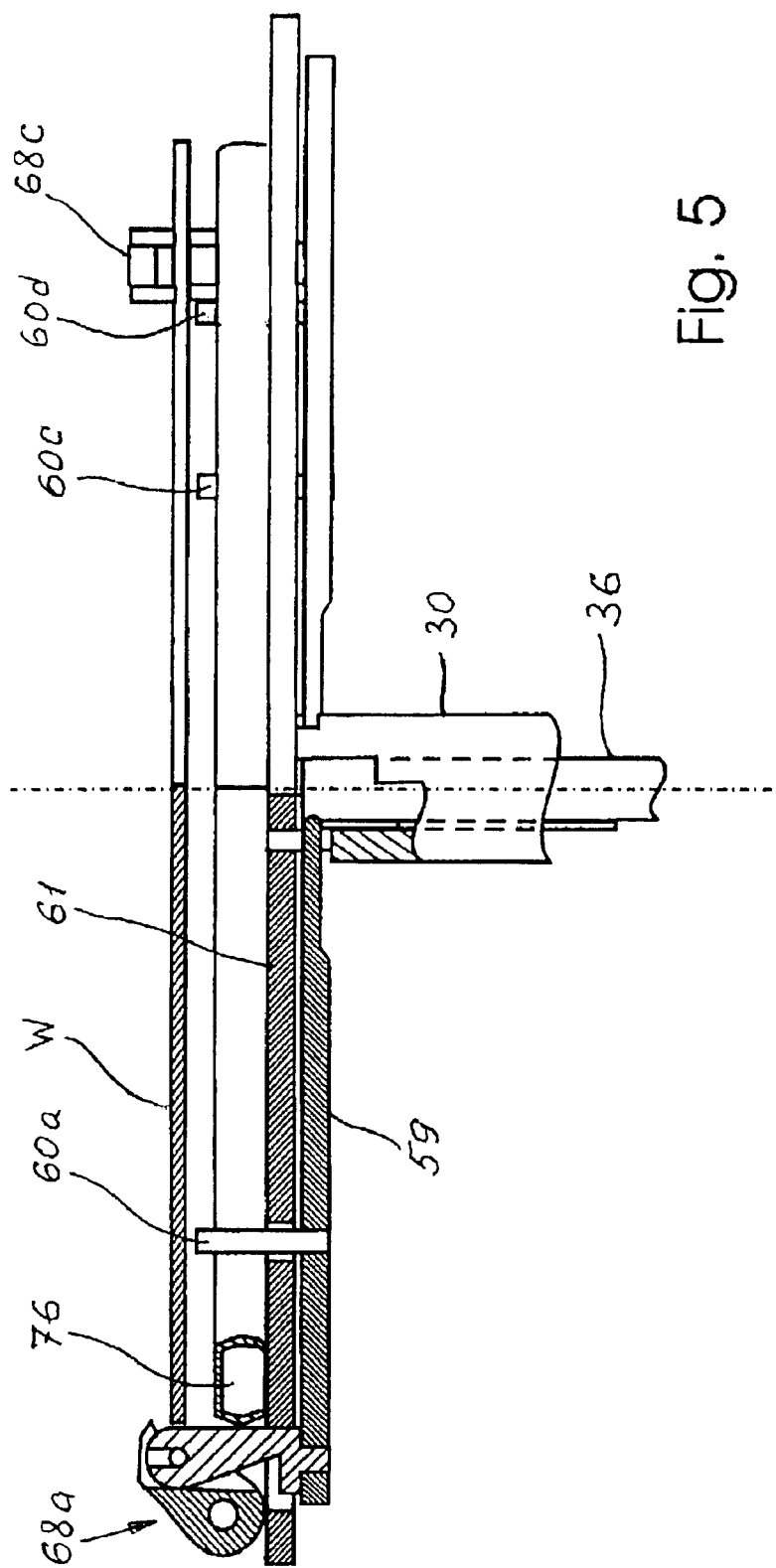
FIG. 5 shows positions of the substrate holder elements during loading of a substrate.
Figure 6:
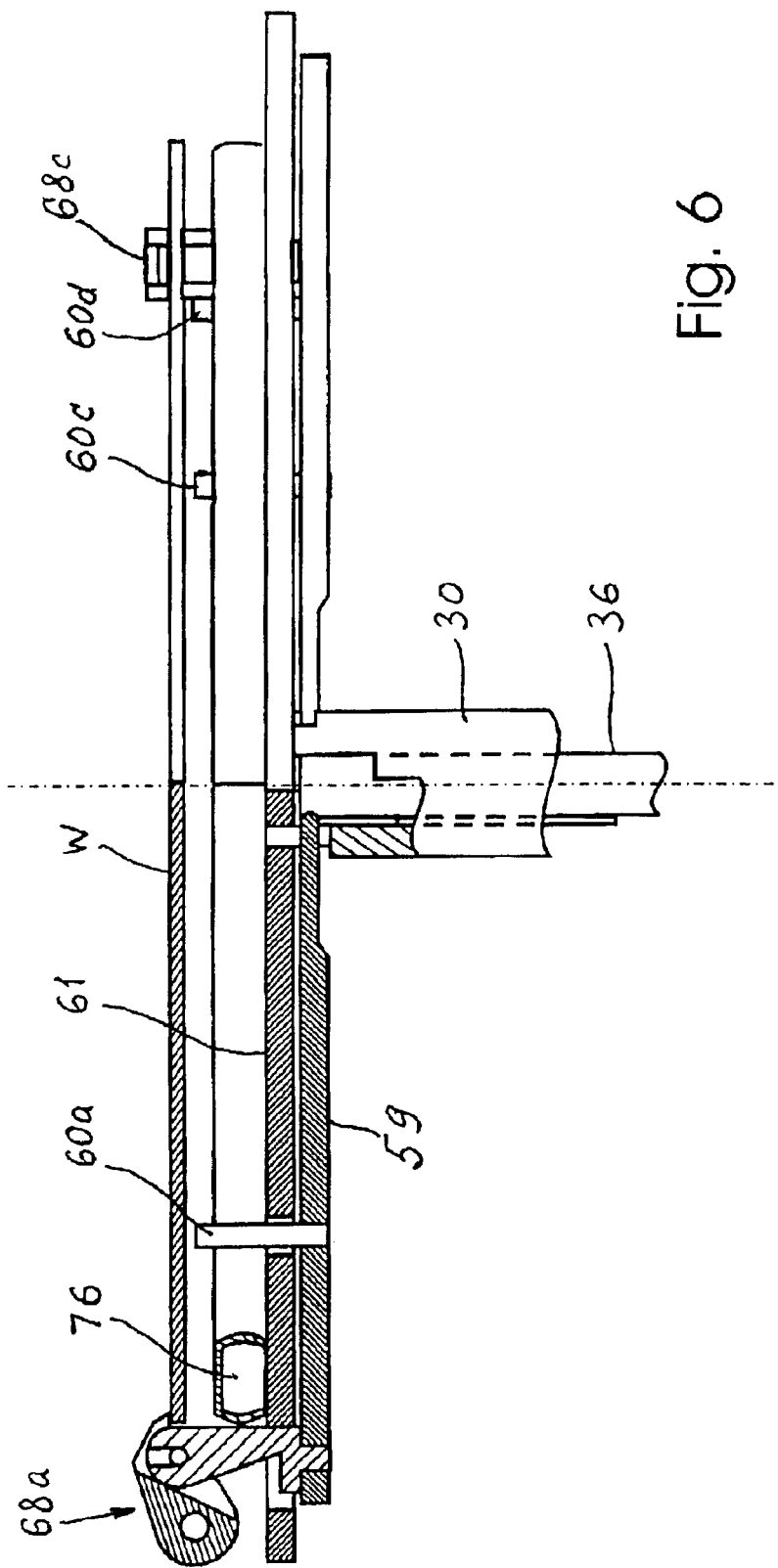
FIG. 6 shows positions of the substrate holder elements during treatment of the substrate from both sides with the substrate clamped by the jaws turned under the effect of centrifugal forces.
Figure 7:
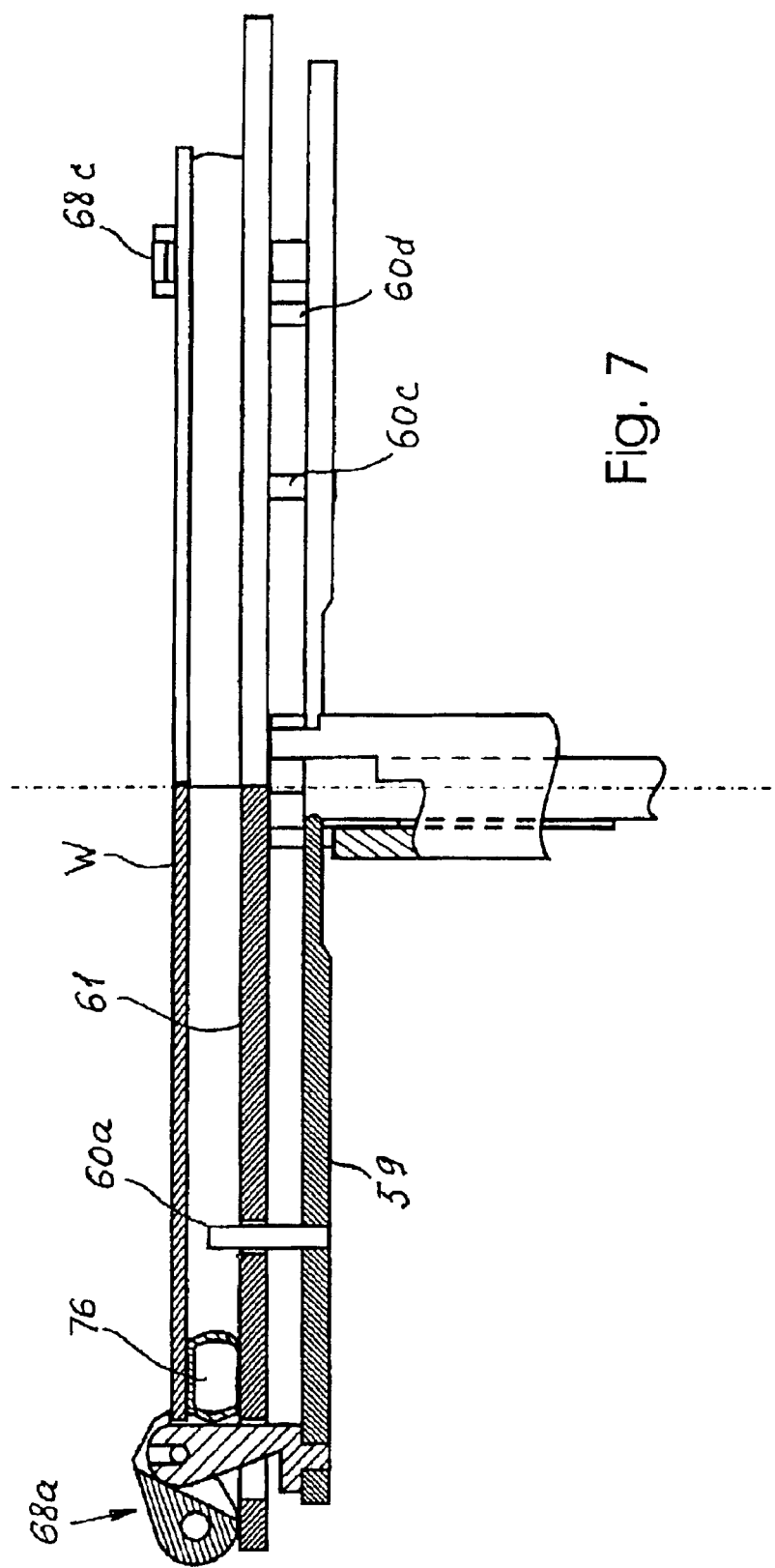
FIG. 7 shows positions of the substrate holder elements with the substrate pressed to the base platform by the clamping jaws under effect of contact with the base platform.

The operation of the substrate holder 33 of the invention will now be described with reference to various operation positions shown in FIGS. 5, 6, and 7 that may be required for the substrate treatment process and which are summarized in Table 1 given below. FIG. 5 shows positions of the substrate holder elements during loading of substrate W. FIG. 6 shows positions of the substrate holder elements during treatment of the substrate W from both sides with the substrate clamped by the jaws turned under the effect of centrifugal forces. FIG. 7 shows positions of the substrate holder elements with the substrate W pressed to the base platform 61.

TABLE 1

| Condition No. | Vertical position of the rod 36 | Frequency of rotation of the shaft 30 (rpm) | Substrate treatment process |
| --- | --- | --- | --- |
| 1 | Uppermost | 0 | Substrate loading position (FIG. 5) |
| 2 | Uppermost | low | Top and backside substrate cleaning, holder cleaning (FIG. 5) |
| 3 | Uppermost | high | Wafer and chuck drying, wafer substrate is clamped (FIG. 6). |
| 4 | Lowermost | 0 | Clamp position, backside sealed (FIG. 7) |
| 5 | Lowermost | low | Wafer top chemical processing (FIG. 7) |
| 6 | Lowermost | high | Wafer top cleaning and drying (FIG. 7) |

Condition No. 1

In order to place the substrate holder 33 (FIG. 1) into Condition 1, the cylinders 46 and 48 are activated for performing the upward stroke of the piston rods 42 and 44, which are withdrawn into the cylinders and lift the cross beam 40 together with the thrust bearing 38 that pushes the rod 36 upward in the shaft 30. The bowl 28 is empty. The upper end of the rod 36 moves up together with the annular plate 59, pins 60a, 60b, 60c, 60d, and 60e and clamping jaws 68a, 68b, 68c, 68d, and 68e. The shaft 30 is stationary. The clamping jaws are in the positions shown for the jaw 68a in FIG. 4 with the shorter arm 68a1 raised. In Condition 1, wafer substrate W can be easily loaded into the substrate holder 33 and placed onto the upper ends of the pins as shown FIG. 5.

Condition 2

In Condition 2, the elements of the substrate holder 33 assume the same position as in Condition 1, with the exception that the shaft 30 slowly rotates from the motor 52 through the pulley 54, driving belt 56, and pulley 50 attached to the lower end of the shaft 30. The substrate W remains in place and is not clamped by the jaws 68a, 68b, 68c, 68d and 68e. The bowl 28 is filled with a cleaning solution. The substrate is immersed into the cleaning solution. Condition 2 is used for cleaning the holder 33 and both sides of the wafer substrate W. Condition 2 is shown in FIG. 5.

Condition 3

In order to place the elements of the substrate holder 33 into Condition 3, the frequency of rotation of the shaft 30 is increased relative to Condition 2 as shown in Table 1. When the shaft begins to rotate, the clamping jaws are turned under the effect of centrifugal forces into positions of clamping the substrate with the shorter arms as shown in FIG. 6. In order not to damage the edge of the substrate W, the jaws may not to contact the substrate W, but stop at a very short distance from the substrate edge, just for restricting the movement of the substrate W. Condition 3 is used for wafer and chuck drying and, therefore, bowl 28 is generally empty during such processing.

Condition 4

Condition 4 is needed, e.g., for sealing the backside of the substrate W against the process solutions. Condition 4 may be used, e.g., during filling of the bowl 28 with the process solution. The elements of the substrate holder assume positions shown in FIG. 7, but the shaft 30 remains stationary. In particular, the cylinders 46 and 48 are activated for extending their piston rods downward, whereby the cross beam 40 is lowered together with the thrust bearing 38, and the rod 36 descends. Lowering of the rod 36 moves the annular plate 59 down together with the pins 60a, 60b, 60c, 60d and 60e such that the upper ends of the pins are flush with the surface of the base platform 61 (FIG. 7). At the same time, as the pins 60a, 60b, 60c, 60d and 60e move down, the rear ends of the longer arms of the clamping jaws, such as the longer arm 68a2 of the clamping jaw 68 shown in FIG. 4, come into contact with the upper surface of the base platform 61, so that the shorter arms of the jaws are turned in a clockwise direction shown in FIG. 7 and clamp the edge of the substrate W. In this manner, the substrate W is clamped by the clamping jaws 68a, 68b, 68c, 68d and 68e and is pressed against the annular seal 76 (FIG. 7). In order not to damage the edge of the substrate W, the jaws may not contact the substrate W, but may stop at a very short distance from the substrate edge, just for restricting the movement of the substrate W.

Condition 5

In condition 5, the elements of the substrate holder assume positions shown in FIG. 7, but the shaft 30 slowly rotates. In Condition 5 is needed for wafer top chemical processing and cleaning, while the backside remains sealed from the process or cleaning solution.

Condition 6

In condition 6, the elements of the substrate holder assume positions shown in FIG. 7, but the shaft 30 rotates with high speed. The bowl 28 may be empty or filled with the process or cleaning solution. Condition 6 is needed for cleaning or drying the top of the substrate W.

Thus, it has been shown that the invention provides a substrate holder for treatment of substances in liquids, which possesses universality and is capable to selectively provide treatment of substrates from both sides or only from the face side, while protecting the backside of the substrate from the effect of the process solution. The substrate holder of the aforementioned type is simple in construction, and utilizes one and the same element for two functions, such as supporting the substrate and controlling operation of substrate clamping elements.

The invention has been shown and described with reference to specific embodiments, which should be construed only as examples and do not limit the scope of practical applications of the invention. Therefore any changes and modifications in technological processes, constructions, materials, shapes, and their components are possible, provided these changes and modifications do not depart from the scope of the patent claims. For example, the rod may be stationary, while the shaft may perform vertical movements on the rod. The radial arms can be longer and may directly support the pins without the use of an annular plate. The longer arms of the clamping jaws may be provided with means for adjusting the turning moment of the jaws. The number of radial arm that support the annular plate may be different from that shown in the drawings. Vertical and rotary drives of the rod and shaft, respectively, may be different from the pair of cylinders and motor shown and described in the specification. The clamping jaws may be attached to the peripheral portions of the annular plate without passing through the base platform.

What is claimed is:

1. A universal substrate holder for treating an object in a fluid, comprising:
   a housing with a bowl which can be filled with a processing liquid;
   first support means installed in said housing;
   a base platform rigidly attached to said first support means and capable of supporting said object;
   second support means that can slide relative to said first support means but cannot rotate independent of said first support means, said second support means having protruding means passing through said base platform for supporting said object;
   object clamping means rigidly connected to an annular plate arranged below the base platform, wherein the object clamping means passes through said base platform for clamping said object above said base platform;
   rotary drive means for rotating said first support means; and
   linear drive means for causing said second support means to preform said slide relative to said first support means in a first direction to a first position in which said protruding means are raised above said base platform to provide a space between said object and said base platform, and in a second direction in which said protruding means assume a second position to place said object above said base platform, said object clamping means having a clamp actuation member capable of turning under the effect of centrifugal forces developed when said rotary drive means rotates said first support means for clamping said object above said base platform when said second support means is moved said first position, said clamp actuation member being capable of clamping said object above said base platform due to engagement with said base platform when said second support means is moved to said second position.

2. The universal substrate holder of claim 1, wherein said object has a face side, backside, and edges, said universal substrate holder further comprising sealing means on said base platform in a position under said edges for sealing said backside from said fluid when said object is placed above said base platform.

3. The universal substrate holder of claim 2, wherein said first support means comprises a shaft installed in said housing with an axial opening, said shaft having one end sealingly projecting into said bowl; said second support means comprising a rod slidingly installed in said axial opening; said axial opening having means for preventing independent rotation of said rod relative to said shaft but allowing for axial movement of said rod in said axial opening relative to said shaft; said rod having a first end that protrudes through said axial opening into said bowl and a second end opposite to said first end that protrudes from an end of said shaft opposite to said one end and is connected to said linear drive means.

4. The universal substrate holder of claim 3, wherein said base platform has a plurality of openings, said protruding means comprising a plurality of pins slidingly passing through said plurality of openings so that when said linear drive means moves said rod towards said first position, said pins protrude above said base platform and are capable of supporting said object above said base platform for forming a space between said backside of said substrate and said base platform.

5. The universal substrate holder of claim 2, wherein said clamp actuation member engages said base platform when said second support means is moved towards to said second position under the effect of said linear drive means.

6. The universal substrate holder of claim 5, wherein said object clamping means comprises a plurality of clamping jaws, each clamping jaw of said plurality comprising a two-arm lever pivotally installed on a pivot and having a heavier arm and a lighter arm, so that in a stationary state said clamping jaw is turned to a position in which said lighter arm is raised up, and so that during rotation of said shaft together with said clamping jaws said heavier arm is turned up under the effect of centrifugal forces and said light arm is turned down and presses onto said object, said clamp actuation member comprising said heavier arm.

7. The universal substrate holder of claim 4, wherein said clamp actuation member engages said base platform, when said second support means is moved towards said second position under the effect of said linear drive means.

8. The universal substrate holder of claim 7, wherein said object clamping means comprises a plurality of clamping jaws, each clamping jaw of said plurality comprising a two-arm lever pivotally installed on a pivot and having a heavier arm and a lighter arm, so that in a stationary state said clamping jaw is turned to a position in which said lighter arm is raised up, and so that during rotation of said shaft together with said clamping jaws said heavier arm is turned up under the effect of centrifugal forces and said light arm is tuned down and presses onto said object, said clamp actuation member comprising said heavier arm.

9. The universal substrate holder of claim 3, wherein said rotary drive means comprises a rotary motor having a first drive member, said end of shaft opposite to said one end supporting a second drive member kinematically connected to said first drive member, said linear drive means comprising at least one cylinder with a piston rod kinematically connected to said second end of said rod for transmitting linear motions to said rod and to said protruding means.

10. The universal substrate holder of claim 9, wherein a part of said base platform engages said object clamping means when said second support means is moved to said second position under the effect of said linear drive means.

11. The universal substrate holder of claim 10, wherein said object clamping means comprises a plurality of clamping jaws, each clamping jaw of said plurality comprising a two-arm lever pivotally installed on a pivot and having a heavier arm and a lighter arm, so that in a stationary state said clamping jaw is turned to a position in which said lighter arm is raised up, and so that during rotation of said shaft together with said clamping jaws said heavier arm is turned up under the effect of centrifugal forces and said light arm is turned down and presses onto said object.

12. A universal substrate holder for treating a wafer substrate in a fluid in an electroless deposition apparatus, comprising:

a housing with a bowl which can be filled with a processing liquid;

a shaft with a central through opening, which is installed in said housing, said shaft having one end protruding from said housing into said bowl and an end opposite to said one end located in said housing;

a base platform rigidly attached to said one end of said shaft and capable of supporting said wafer substrate, said base platform having a plurality of openings;

a rod slidingly inserted into said central through opening, said central through opening having at least one splice that allows said rod to slide relative to said shaft in said central through opening but does not allow said rod to independently rotate relative to said shaft, said rod having a first end that protrudes from said shaft into said bowl and a second end that protrudes from said shaft into said housing;

a plurality of radial arms attached to said first end of said rod, said radial arms rigidly supporting an annular plate with a plurality of pins rigidly attached thereto, said pins being capable of scalingly protruding through said plurality of openings, said wafer substrate having a face side, a backside, and a periphery;

object clamping means rigidly supported by said annular plate and positioned outside said periphery of said wafer substrate so as to be able to engage said periphery for clamping said substrate above said base platform;

rotary drive means for rotating said shaft; and linear drive means for causing said rod to slide relative to said shaft in a first direction to a first position in which said pins are raised above said base platform to provide a space between said substrate and said base platform and in a second direction in which said pins assume a second position flush with said base platform;

said object clamping means having a clamp actuation member capable of turning under the effect of centrifugal forces developed when said rotary drive means rotate said shaft for clamping said substrate above said base platform when said rod is moved to said first position; said clamp actuation member being capable of clamping said substrate above said base platform due to engagement with said base platform when said pins are moved to said second position.

13. The universal substrate holder of claim 12, wherein said clamp actuation member engages said base platform when said rod is moved towards said second position under the effect of said linear drive means.

14. The universal substrate holder of claim 13, wherein said object clamping means comprises a plurality of clamping jaws, each clamping jaw of said plurality comprising a two-arm lever pivotally installed on a pivot and having a heavier arm and a lighter arm, so that in a stationary state said clamping jaw is turned into a position in which said lighter arm is raised up, and so that during rotation of said shaft together with said clamping jaws said heavier arm is turned up under the effect of centrifugal forces and said light arm is turned down and presses onto said wafer substrate said clamp actuation member comprising said heavier arm.

15. A method, comprising:

positioning an object upon a plurality of pins extending through a plurality of openings within a base platform of a substrate holder; and lowering the plurality of pins and an annular plate to which the plurality of pins are affixed relative to the base platform to place a first arm of a clamping jaw coupled to the annular plate in contact with the base platform.

16. The method of claim 15, wherein the step of lowering the plurality of pins and annular plate causes a second arm of the clamping jaw to be moved above at least a portion of the object subsequent to placing the first arm in contact with the base platform.

17. The method of claim 15, further comprising rotating the base platform to a cause a centrifugal force sufficient to tilt the second arm to be above at least a portion of the object prior to the step of lowering the plurality of pins and annular plate.

18. The method claim 15, further comprising exposing upper and lower surfaces of the positioned object to processing fluids prior to the step of lowering the plurality of pins and annular plate.

19. The method claim 15, wherein the step of lowering the plurality of pins and annular plate comprises lowering the object upon an annular seal such that lower surfaces of the object are not exposed to fluids during subsequent processing.

20. The method of claim 15, wherein the step of lowering the plurality of pins and annular plate comprises lowering the plurality of pins to be flush with an upper surface of the base platform.

* * * * *

UNITED STATES PATENT AND TRADEMARK OFFICE
CERTIFICATE OF CORRECTION

PATENT NO.    : 6,935,638 B2
DATED         : August 30, 2005
INVENTOR(S)   : Ivanov et al.

It is certified that error appears in the above-identified patent and that said Letters Patent is hereby corrected as shown below:

<u>Column 9,</u>
Line 51, delete "preform" and substitute -- perform --.
Line 62, after "means is moved" insert -- to --.

<u>Column 10,</u>
Line 56, delete "tuned" and substitute -- turned --.

<u>Column 11,</u>
Line 27, delete "splice" and substitute -- spline --.
Line 37, delete "scalingly" and substitute -- sealingly --.

Signed and Sealed this

Second Day of May, 2006

JON W. DUDAS
*Director of the United States Patent and Trademark Office*